United States Patent
Dordi et al.

(10) Patent No.: US 8,084,356 B2
(45) Date of Patent: Dec. 27, 2011

(54) METHODS OF LOW-K DIELECTRIC AND METAL PROCESS INTEGRATION

(75) Inventors: Yezdi N. Dordi, Palo Alto, CA (US); Arthur M. Howald, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 12 days.

(21) Appl. No.: 12/212,611

(22) Filed: Sep. 17, 2008

(65) Prior Publication Data

US 2009/0087980 A1   Apr. 2, 2009

Related U.S. Application Data

(60) Provisional application No. 60/976,431, filed on Sep. 29, 2007.

(51) Int. Cl.
*H01L 21/4763* (2006.01)
*H01L 21/302* (2006.01)
*H01L 21/461* (2006.01)

(52) U.S. Cl. .............. 438/626; 438/692; 257/E21.583

(58) Field of Classification Search .......... 438/626, 438/692; 257/E21.583
See application file for complete search history.

(56) References Cited

U.S. PATENT DOCUMENTS

| | | | |
|---|---|---|---|
| 5,384,167 A * | 1/1995 | Nishiwaki et al. | 427/569 |
| 6,048,798 A | 4/2000 | Gadgil et al. | |
| 6,054,379 A | 4/2000 | Yau et al. | |
| 6,072,227 A | 6/2000 | Yau et al. | |
| 6,155,199 A | 12/2000 | Chen et al. | |
| 6,168,726 B1 | 1/2001 | Li et al. | |
| 6,346,489 B1 | 2/2002 | Cohen et al. | |
| 6,436,808 B1 | 8/2002 | Ngo et al. | |
| 6,465,372 B1 | 10/2002 | Xia et al. | |
| 6,893,956 B2 | 5/2005 | Ruelke et al. | |
| 6,969,911 B2 * | 11/2005 | Abe | 257/751 |
| 7,144,828 B2 | 12/2006 | Lu et al. | |
| 7,273,808 B1 | 9/2007 | Lin | |
| 2006/0006140 A1 | 1/2006 | Lakshmanan et al. | |
| 2006/0063386 A1 | 3/2006 | Tsai et al. | |
| 2006/0252252 A1 * | 11/2006 | Zhu et al. | 438/618 |
| 2007/0077761 A1 | 4/2007 | Lehr et al. | |

FOREIGN PATENT DOCUMENTS

WO   WO 2009/045864 A3   4/2009

OTHER PUBLICATIONS

Y.H. Wang et al., "Reduction of Oxygen Plasma Damaged by Postdeposition Helium Plasma Treatment for Carbon Doped Silicon Oxide Low Dielectric Constant Films," Electrochemical and Solid-State Letters, 6 (1) F1-F3 (2003), available electronically Nov. 1, 2002.

(Continued)

*Primary Examiner* — Alexander Ghyka
*Assistant Examiner* — Seahvosh Nikmanesh
(74) *Attorney, Agent, or Firm* — Larry Williams

(57) ABSTRACT

An integrated process for forming metallization layers for electronic devices that use damascene structures that include low-k dielectric and metal. According to one embodiment of the present invention, the integrated process includes planarizing a gapfill metal in low-k dielectric structures, generating a protective layer on the low-k dielectric followed by cleaning the surface of the gapfill metal. Another embodiment of the present invention includes a method of protecting low-k dielectrics such as carbon doped silicon oxide.

21 Claims, 1 Drawing Sheet

OTHER PUBLICATIONS

W. Chen et al., "Plasma Impacts to an O-SiC Low-k Barrier Film," Journal of the Electrochemical Society, 151 (8) F182-F188 (2004), available electronically Jul. 9, 2004.

A. Humbert et al., "Effect of Plasma Treatments on Ultra low-k Material Properties," Microelectronic Engineering 82 (2005) 399-404, available online Aug. 15, 2005.

* cited by examiner

METHODS OF LOW-K DIELECTRIC AND METAL PROCESS INTEGRATION

CROSS REFERENCES

This application claims benefit of U.S. Patent Application Ser. No. 60/976,431, titled "METHODS OF LOW K DIELECTRIC AND METAL PROCESS INTEGRATION" to Yezdi N. DORDI and Arthur M. HOWALD, filed Sep. 29, 2007. U.S. Patent Application Ser. No. 60/976,431, filed Sep. 29, 2007, is incorporated herein, in its entirety, by this reference

BACKGROUND

This invention pertains to fabrication of electronic devices such as integrated circuits that use low-k dielectrics in metallization layers; more specifically this invention relates to low-k dielectric process integration for fabricating integrated circuits.

The extreme performance requirements and the complexity of the devices pose challenges for the fabrication of electronic devices. The fabrication of such devices may require hundreds of process steps of a variety of types. Many of the process steps must be performed with severe tolerances for the results of each of the process steps. Frequently, there are unfavorable interactions between various process steps where the process conditions required for one process step have an adverse effect on prior or subsequent process steps. Because of this complexity, it is often difficult to identify the cause of a process integration problem. After identifying the cause of a process integration problem, there still remains the difficult task of finding a solution for the problem. In order to fabricate high-performance electronic devices so as to achieve high yield and acceptable cost, process integration problems, when discovered, need to be solved.

SUMMARY

This invention pertains to metallization for electronic devices. The present invention seeks to overcome one or more process integration problems for fabricating electronic devices such as for fabricating semiconductor devices that use integrated circuits.

One aspect of the present invention is a method of processing a wafer having a low-k dielectric patterned with structures for metallization and a gapfill metal filling the structures. According to one embodiment of the present invention, the method includes planarizing the gapfill metal to form the metallization. The method also includes generating a protective layer on the low-k dielectric after planarizing the gapfill metal. After generating the protective layer, the method includes cleaning the surface of the gapfill metal.

Another embodiment of the present invention includes a method of protecting a low-k dielectric such as carbon doped silicon oxide.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

DESCRIPTION

Figure 1:
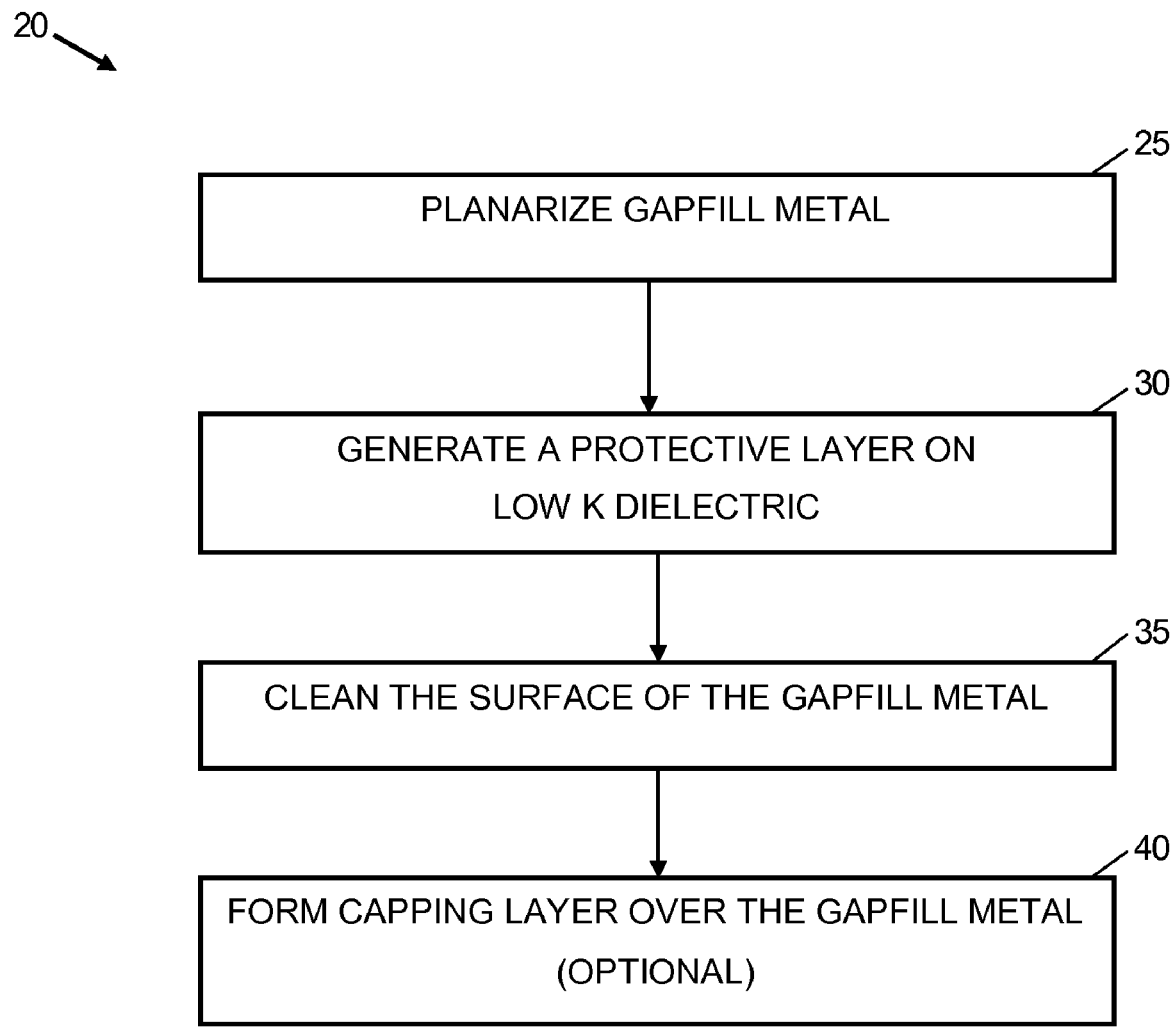
FIG. 1 is a process flow diagram of an embodiment of the present invention.

The present invention pertains to interconnect metallization that uses an electrically conductive metal and a low-k dielectric for electronic devices such as integrated circuits. More specifically, the present invention pertains to methods of fabricating interconnect metallization layers that include a metal such as copper and low-k dielectric such as carbon doped silicon oxide for electronic devices such as integrated circuits.

The operation of embodiments of the present invention will be discussed below, primarily in the context of processing semiconductor wafers such as silicon wafers used for fabricating integrated circuits. The metallization layers for integrated circuits include copper for metal lines formed into damascene or dual damascene low-k dielectric structures. The low-k dielectric is a material such as a carbon doped silicon oxide (SiOC:H). However, it is to be understood that embodiments in accordance with the present invention may be used for other semiconductor devices, metals other than copper, and semiconductor wafers other than silicon.

Reference is now made to FIG. 1 where there is shown a flow diagram 20 of a method according to one embodiment of the present invention. Flow diagram 20 shows a method of processing a wafer having a low-k dielectric patterned with structures for damascene or dual damascene metallization and a gapfill metal filling the structures for the damascene or dual damascene metallization. The method includes planarizing the gapfill metal 25, generating a protective layer on the low-k dielectric 30, and cleaning the surface of the gapfill metal 35. As an option, flow diagram 20 may include forming a capping layer over the gapfill metal 40 or one or more other subsequent processes for processing the wafer.

According to one embodiment of the present invention, planarizing the gapfill metal 25 is accomplished by a process such as chemical mechanical planarization. Chemical mechanical planarization is a well-known process used in fabrication of semiconductor devices. Generally, chemical mechanical planarization of gapfill metal involves using a polishing pad and slurry to contact the surface of the gapfill metal while relative motion is established between the polishing pad and the surface of the gapfill metal. Physical and chemical interactions between the polishing pad, the slurry, and the surface of the gapfill metal causes removal of the gapfill metal until a substantially planar surface is formed for the low-k dielectric and the gapfill metal. Copper is a preferred gapfill metal for embodiments of the present invention. The use of copper with a low-k dielectric has become a commonly used combination of materials for metallization layers in electronic devices. Numerous chemical mechanical planarization processes have been reported in the literature for damascene and dual damascene low-k dielectric and copper metallization layers.

A variety of methods may be used to generate the protective layer on the low-k dielectric 30. According to a preferred embodiment of the present invention, generating the protective layer on the low-k dielectric is accomplished by exposing the low-k dielectric to a plasma operated at conditions effective to generate the protective layer. As options, embodiments of the present invention may use a plasma generated by methods such as, but not limited to, capacitively coupled plasma, inductively coupled plasma, and microwave generated plasma. For some embodiments of the present invention, the wafers may be electrically grounded while the protective layer is generated on the low-k dielectric. For preferred embodiments of the present invention, the wafers are electrically biased while the protective layer is generated on the low-k dielectric.

The present inventors have discovered that an inductively coupled plasma such as a *Transformer Coupled Plasma* (TCP™, a trademark of Lam Research Corporation, Fremont, Calif.) operating substantially without heating the wafer and with an electrical bias applied to the wafer generates a preferred protective layer on the low-k dielectric for some embodiments of the present invention. Generating the protective layer using this new process is beneficial because the protective layer can be produced substantially without heating the wafer so that it is substantially at room temperature. Also, the protective layer can be generated in a short time, generally within a matter of a few seconds. The damage to the low-k dielectric from forming the protective layer is also low. These benefits are particularly suitable for a follow on post-chemical mechanical planarization process. This means that the low-k dielectric can be provided with protection after chemical mechanical planarization and before plasma cleaning the surface of the gapfill metal 35.

For some embodiments of the present invention, cleaning the surface of the gapfill metal 35 uses a plasma process such as an oxygen containing plasma to generate chemical species for removing contaminants on the surface of the gapfill metal. Cleaning the surface of the gapfill metal 35 may also include a plasma process such as using a hydrogen containing plasma to generate chemical species for removing contaminants such as oxides from the surface of the gapfill metal. As an option for some embodiments of the present invention, generating the protective layer on the low-k dielectric 30 may be accomplished using the same processing chamber used for cleaning the surface of the gapfill metal 35. More specifically for this embodiment, the process sequence includes planarizing the gapfill metal followed by generating the protective layer on the low-k dielectric followed by cleaning the surface of the gapfill metal. An inherent result of the way that the gapfill metal is cleaned is that the surface of the low-k dielectric may also be cleaned if contaminants are present on the low-k dielectric.

According to one embodiment of the present invention, generation of a protective layer on the low-k dielectric on a 200 millimeter (mm) diameter wafer is accomplished by exposing the low-k dielectric to an inductively coupled plasma using process conditions that include 200 standard cubic centimeters per minute (sccm) helium, 20 m Torr gas pressure, 250 Watts (W) of inductively coupled radio frequency (RF) power at 13.56 megaHertz (MHz), 50 W of bias RF power at 13.56 MHz, duration of 15 seconds, and wafer holder temperature of 20° C. For a 300 mm diameter wafer, the inductively coupled power may be set at about the 250 W and the bias RF power is increased to about 100 W. Additional information about inductively coupled plasma and examples of suitable equipment for forming inductively coupled plasma is available in the literature. For examples, see commonly owned U.S. Pat. No. 6,048,798 and U.S. Pat. No. 6,155,199; the contents of these patents are incorporated herein in their entirety by this reference.

Additional options for preferred embodiments of the present invention include, but are not limited to, the following: A nitrogen plasma such as a plasma formed using molecular nitrogen can be used to generate a protective layer on the low-k dielectric; the surface of the gapfill metal can then be cleaned by an oxygen containing plasma followed by a hydrogen containing plasma. An argon plasma can be used to generate a protective layer on the low-k dielectric; the surface of the gapfill metal can then be cleaned by an oxygen containing plasma followed by a hydrogen containing plasma. A neon plasma can be used to generate a protective layer on the low-k dielectric; the surface of the gapfill metal can then be cleaned by an oxygen containing plasma followed by a hydrogen containing plasma. A helium plasma can be used to generate a protective layer on the low-k dielectric; the surface of the gapfill metal can then be cleaned by an oxygen containing plasma followed by a hydrogen containing plasma. Optionally, the hydrogen containing plasma may be performed before the oxygen plasma. Also as an option, the hydrogen plasma and the oxygen plasma may be conducted as a downstream plasma process wherein plasma is generated remotely from the wafer and chemical species from the plasma are allowed to flow to a process chamber for exposure to the wafer.

Another embodiment of the present invention includes a method of protecting a low-k dielectric such as carbon doped silicon oxide for electronic device processing. According to this method, the low-k dielectric layer is provided on a substrate such as a semiconductor wafer. The method includes applying an electrical bias to the low-k dielectric while exposing the low-k dielectric to an inductively coupled plasma so as to form a protective surface on the low-k dielectric at substantially room temperature. As an option for embodiments of the present invention, the plasma contains one or more gases including, but not limited to, helium, argon, and neon. Another option for an embodiment of the present invention includes using molecular nitrogen to form the plasma. According to one embodiment of the present invention, the plasma is formed in substantially pure helium, neon, argon, or molecular nitrogen. A preferred embodiment of the present invention uses an inductively coupled plasma and the low-k dielectric is directly exposed to the plasma while RF power is also applied to the wafer so as to provide an electrical bias for the low-k dielectric.

Another embodiment of the present invention includes a method of processing a wafer. The method includes using a deposition chamber to deposit a carbon doped silicon oxide low-k dielectric on the wafer and providing a plasma to generate a protective layer on the low-k dielectric in situ. More specifically, the protective layer on the low-k dielectric is generated while the wafer remains in the deposition chamber. The method also includes forming damascene structures in the low-k dielectric and depositing gapfill copper to fill the damascene structures. The method includes using chemical mechanical planarization to planarize the gapfill copper so as to produce a substantially planar surface for the low-k dielectric and the gapfill copper. Preferably, the method includes using an inductively coupled plasma to generate a second protective layer on the low-k dielectric. The second protective layer is generated with an electrical bias applied to the low-k dielectric during formation of the protective layer. After generating the second protective layer, the method includes cleaning the surface of the planarized gapfill copper using an oxygen containing plasma and using a hydrogen containing plasma. The method then includes applying a capping layer to the planarized gapfill copper after the cleaning. As an option for some embodiments of the present invention, the capping layer may include a material such as cobalt. For a preferred embodiment of the present invention, applying the capping layer is accomplished with an electrochemical process. Other materials suitable for use as the capping layer are materials typically used as metallization diffusion barriers for copper. Examples of the material suitable for use as the capping layer include, but are not limited to, tantalum, tantalum nitride, ruthenium, aluminum oxide, silicon carbide, and silicon nitride.

TABLE 1 shows examples of experimental results of exposing wafers with a low-k dielectric known by the trade name Black Diamond, identified as BD-1 in TABLE 1, to a 2-minute downstream oxygen plasma after various plasma pre-treatments. The conditions used for the downstream oxygen plasma included 900 sccm oxygen, plasma source pressure 1 Torr, plasma source RF power 2.5 kW at 13.56 MHz (alternatively, 2.5 kW microwave power at 2.45 GHz), and wafer temperature of 20° C. According to U.S. Pat. No. 6,168,726, Black Diamond is a low-k dielectric of carbon-doped silica, which is referred to as oxidized organo-silane. Methods and equipment for forming Black Diamond have been presented in U.S. Pat. No. 6,054,379 and U.S. Pat. No. 6,072,227. Typically, the formation of Black Diamond low-k dielectric uses a chemical vapor deposition (CVD) process with gaseous precursors of an organo-silane and an oxidizer to form a dielectric layer having a dielectric constant in the range of 2.5 to 3. The CVD process may be carried out in a low-power capacitively coupled plasma having a power density on the wafer of less than 1 W/cm$^2$ and at a temperature of less than 100° C. Optionally, other processes may be used to produce low-k dielectrics such as Black Diamond and such as other carbon doped silicon oxide.

In TABLE 1, the columns labeled "$\Delta$Si—CH$_3$" show the change in infrared absorbance of Si—CH$_3$ chemical bonds in the Black Diamond low-k dielectric. The destruction of these bonds and resulting decrease in infrared absorbance are one indicator of damaged low-k dielectric material.

TABLE 1

| Case | Treatment of BD-1 Blanket Layer on Silicon Wafer | $\Delta$Si—CH$_3$ Measured After Treatment | $\Delta$Si—CH$_3$ Measured After O$_2$ Plasma |
|---|---|---|---|
| 1 | None | N/A | 40% |
| 2 | In-situ He plasma treatment in deposition chamber | 10% (Estimated) | 0 additional |
| 3 | TCP ™ He plasma for 30 sec, no electrical bias | 8% | 24% additional |
| 4 | TCP ™ He plasma for 15 sec, with electrical bias | 13% | 0% additional |
| 5 | TCP ™ Ar plasma for 15 sec, with electrical bias | 13% | 0% additional |
| 6 | TCP ™ N$_2$ plasma for 15 sec, with electrical bias | 6% | 0% additional |

Information for Case 1, as shown in TABLE 1, is provided as a reference for comparison with experimental results from embodiments of the present invention. For Case 1, a layer of Black Diamond low-k dielectric on a silicon wafer was subjected to the downstream oxygen plasma as described above. The low-k dielectric layer had not received any protection treatment prior to the oxygen plasma. After the oxygen plasma there was a 40% change in the amount of Si—CH$_3$ bonds.

Case 2 was performed with a layer of Black Diamond low-k dielectric on a silicon wafer. The low-k dielectric for Case 2 was deposited on a silicon wafer and received a helium plasma treatment to form a protective layer. The helium plasma treatment was performed before removing the low-k dielectric from the deposition chamber, i.e., in situ generation of the protective layer. The helium plasma treatment was performed using a capacitively coupled plasma with the silicon wafer supported on the grounded electrode. As a result of the way that the protective layer was formed, direct measurements of the change in the amount of Si—CH$_3$ bonds for Case 2 as a result of generating the protective layer are not available. However, it is estimated that the change in the amount of Si—CH$_3$ bonds for Case 2 as a result of generating the protection layer is about 10%. Exposure of the low-k dielectric for Case 2 to the oxygen plasma as described above showed no additional change in the amount of Si—CH$_3$ bonds.

Case 3 was performed with a layer of Black Diamond low-k dielectric deposited on a silicon wafer. The low-k dielectric for Case 3 was deposited in a deposition chamber. A protective layer was generated on the low-k dielectric by exposing the low-k dielectric to an inductively coupled helium plasma for 30 seconds. The inductively coupled plasma was formed using a process chamber such as commercially available transformer coupled plasma systems made by Lam Research Corporation of Fremont, Calif. The process conditions used for the helium plasma included 200 sccm He, 20 mTorr, 500 W source RF power at 13.56 MHz, 0 W bias RF power, wafer temperature of 20° C., and duration of 30 seconds. Generation of the protective layer on the low-k dielectric for Case 3 produced about an 8% change in the amount of Si—CH$_3$ bonds. Exposure of the low-k dielectric with protective layer to the oxygen plasma as described above showed an additional change of about 24% in the amount of Si—CH$_3$ bonds. In other words, the protective layer generated for Case 3 provides a significant amount of protection from damage caused by the oxygen plasma exposure.

Case 4 was performed with a layer of Black Diamond low-k dielectric deposited on a silicon wafer. The low-k dielectric for Case 4 was deposited in a deposition chamber. A protective layer was generated on the low-k dielectric by exposing the low-k dielectric to an inductively coupled helium (He) plasma for 15 seconds. The inductively coupled plasma was formed using the same type of inductively coupled plasma process chamber used for Case 3. The process conditions used for the helium plasma were 200 sccm He, 20 m Torr, 250 W source RF power at 13.56 MHz, 50 W bias RF power at 13.56 MHz, wafer temperature of 20° C., and duration of 15 seconds. The generation of the protective layer for Case 4 produced about a 13% change in the amount of Si—CH$_3$ bonds. Exposure of the low-k dielectric with the protective layer to the oxygen plasma as described above showed no additional change in the amount of Si—CH$_3$ bonds. More specifically, the protective layer generated for Case 4 provides substantially complete protection from damage by the oxygen plasma.

Case 5 was performed with a layer of Black Diamond low-k dielectric deposited on a silicon wafer. The low-k dielectric for Case 5 was deposited in a deposition chamber. A protective layer was generated on the low-k dielectric by exposing the low-k dielectric to an inductively coupled argon (Ar) plasma for 15 seconds. The inductively coupled plasma was formed using the same type of inductively coupled plasma process chamber used for Case 3. The process conditions used for the argon plasma were 200 sccm Ar, 20 mTorr, 250 W source RF power at 13.56 MHz, 50 W bias RF power at 13.56 MHz, wafer temperature 20° C., and duration of 15 seconds. The generation of the protective layer for Case 5 produced about a 13% change in the amount of Si—CH$_3$ bonds. Exposure of the low-k dielectric with the protective layer to the oxygen plasma as described above showed no additional change in the amount of Si—CH$_3$ bonds. More specifically, the protective layer generated for Case 5 provides substantially complete protection from damage by the oxygen plasma.

In Case 6, the present inventors have shown that an inductively coupled nitrogen (N$_2$) plasma can produce essentially the same protection effect achieved with the inductively coupled helium plasma and argon plasma described above but also with less damage caused by the formation of the protective layer. The inductively coupled plasma was formed using the same type of inductively coupled plasma process chamber used for Case 3. The process conditions for the inductively coupled nitrogen plasma used for Case 6 included 200 sccm N$_2$, 20 mTorr, 250 W source RF power at 13.56 MHz, 50 W bias RF power at 13.56 MHz, wafer temperature of 20° C., and duration of 15 seconds. The results showed a change in the amount of Si—CH$_3$ bonds after treatment of only about 6% and an additional change in the amount of Si—CH$_3$ bonds measured after the oxygen plasma of about 0%. More specifically, the protective layer generated for Case 6 provides substantially complete protection from damage by the oxygen plasma.

TABLE 1 shows that the protective layers generated on the low-k dielectric for Case 4, Case 5, and Case 6, which were generated in a chamber other than the deposition chamber and at 20° C., provide essentially the same amount of protection achieved for Case 2 done with in situ generation of the protective layer. Consequently, embodiments of the present invention that use process conditions about the same or similar to those used for Case 4, Case 5, and Case 6 are particularly beneficial for use in process integration. More specifically, process integration for metallization layers that include metal and low-k dielectrics can be accomplished with greater ease by generating or regenerating a protective layer on the low-k dielectric after planarization of the metal layer and before use of a cleaning process that includes an oxygen plasma or similar damage source. This also means that a protective layer on the low-k dielectric can be conveniently regenerated if the protective layer has been damaged or removed during a prior process step such as chemical mechanical planarization of gapfill metal.

The process conditions used for Case 4, Case 5, and Case 6 are examples of embodiments of the present invention. Other embodiments of the present invention may use other plasma process conditions effective to generate the protective layer. Process conditions that may be suitable for embodiments of the present invention include, but are not limited to, gas flow from 50 to 500 sccm, pressure from 10 to 80 mTorr, source RF power from 100 to 1000 W, bias RF power from 20 to 100 W, wafer temperature from 0° to 80° C., plasma exposure time from 5 to 30 seconds, and all values and subranges subsumed therein for each range of the process conditions used to form the protective layer. These process conditions are expected to be suitable for use with gases such as but not limited to argon, helium, neon, and nitrogen. Additional benefits may be achieved with using gases other than those listed in TABLE 1.

Another embodiment of the present invention includes a method of process integration for metallization layers having metal and low-k dielectric. The method includes generating or regenerating a protective layer on the low-k dielectric prior to any process step such as an oxygen plasma that can damage the low-k dielectric. According to a preferred embodiment of the present invention, the generation of the protective layer on the low-k dielectric is included as part of a process for preparation of the exposed metal surface for plating without further damaging exposed areas of the low-k dielectric.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A method of processing a wafer having a low-k dielectric patterned with structures for damascene or dual damascene metallization and a gapfill metal filling the structures, the method comprising:
   planarizing the gapfill metal;
   generating a protective layer on the low-k dielectric by exposing the low-k dielectric to an inductively coupled plasma with an electrical bias; and
   cleaning the surface of the gapfill metal;
   wherein the generating the protective layer is done prior to the cleaning the surface of the gapfill metal.

2. The method of claim 1, wherein planarizing the gapfill metal is accomplished by chemical mechanical planarization.

3. The method of claim 1, wherein the gapfill metal comprises copper.

4. The method of claim 1, wherein generating the protective layer on the low-k dielectric is accomplished by exposing the low-k dielectric to a plasma operated at conditions effective to generate the protective layer.

5. The method of claim 1, wherein generating the protective layer on the low-k dielectric is accomplished by exposing the low-k dielectric to an inductively coupled plasma at process conditions including gas flow from 50 to 500 sccm, pressure from 10 to 80 mTorr, source RF power from 100 to 1000 W, bias RF power from 20 to 100 W, wafer temperature from 0° C. to 80° C., plasma exposure time from 5 to 30 seconds, and all values and subranges subsumed therein.

6. The method of claim 1, wherein generating the protective layer on the low-k dielectric is accomplished by exposing the low-k dielectric to a capacitively coupled plasma.

7. The method of claim 1, wherein generating the protective layer on the low-k dielectric is accomplished using a N$_2$ plasma and cleaning the surface of the gapfill metal is accomplished using an oxygen containing plasma and a hydrogen containing plasma.

8. The method of claim 1, wherein generating the protective layer on the low-k dielectric is accomplished using an argon plasma and cleaning the surface of the gapfill metal is accomplished using an oxygen containing plasma and a hydrogen containing plasma.

9. The method of claim 1, wherein generating the protective layer on the low-k dielectric is accomplished using a neon plasma and cleaning the surface of the gapfill metal is accomplished using an oxygen containing plasma and a hydrogen containing plasma.

10. The method of claim 1, wherein generating the protective layer on the low-k dielectric is accomplished using a helium plasma and cleaning the surface of the gapfill metal is accomplished using an oxygen containing plasma and a hydrogen containing plasma.

11. The method of claim 1, further comprising applying a capping layer over the gapfill metal following cleaning the surface of the gapfill metal.

12. A method of protecting a low-k dielectric for electronic device processing, the method comprising applying an electrical bias to the low-k dielectric while exposing the low-k dielectric to an inductively coupled plasma effective to generate a protective surface on the low-k dielectric substantially without heating the low-k dielectric; wherein the protective surface is generated prior to a post chemical mechanical planarization cleaning.

13. The method of claim 12, wherein the plasma contains helium.

14. The method of claim 12, wherein the plasma contains argon.

15. The method of claim 12, wherein the plasma contains neon.

16. The method of claim 12, wherein the plasma contains molecular nitrogen.

17. A method of processing a wafer comprising: using a deposition chamber to deposit a carbon doped silicon oxide low-k dielectric on the wafer and providing a plasma to generate a protective layer on the low-k dielectric in situ; forming damascene structures in the low-k dielectric; depositing gapfill copper to fill the damascene structures; using chemical mechanical planarization to planarize the gapfill copper; using an inductively coupled plasma to generate a second protective layer on the low-k dielectric; cleaning the surface of the planarized gapfill copper using an oxygen containing plasma and using a hydrogen containing plasma; and applying a capping layer to the gapfill copper; wherein the generating the second protective layer is done prior to the cleaning the surface of the planarized gapfill copper.

18. The method of claim 17, wherein the capping layer comprises cobalt.

19. The method of claim 17, wherein the capping layer comprises a metallization diffusion barrier for copper.

20. The method of claim 17, wherein applying the capping layer is accomplished with an electrochemical process.

21. The method of claim 17, wherein the inductively coupled plasma to generate the second protective layer on the low-k dielectric uses 200 sccm $N_2$, 20 mTorr, 250 W source RF power at 13.56 MHz, 50 W bias RF power at 13.56 MHz, and the wafer temperature is 20° C. while exposed to the inductively coupled plasma.

* * * * *